United States Patent
Marsh

(12) United States Patent Marsh
(10) Patent No.: US 6,473,510 B1
(45) Date of Patent: Oct. 29, 2002

(54) AC POWER SOURCE FILTER FOR AUDIO VIDEO ELECTRICAL LOAD

(75) Inventor: Richard N. Marsh, Cool, CA (US)

(73) Assignee: Monster Cable Products, Inc., Brisbane, CA (US)

( * ) Notice: Subject to any disclaimer, the term of this patent is extended or adjusted under 35 U.S.C. 154(b) by 0 days.

(21) Appl. No.: 09/054,738

(22) Filed: Apr. 3, 1998

(51) Int. Cl.[7] .......... H04B 15/00; H04B 3/00; H03H 7/00
(52) U.S. Cl. .......... 381/94.6; 381/94.5; 381/77; 333/168; 333/169; 333/181
(58) Field of Search .......... 381/94.5, 94.6, 381/77; 333/168–169, 181

(56) References Cited

U.S. PATENT DOCUMENTS

| | | | | |
|---|---|---|---|---|
| 3,529,233 A | * | 9/1970 | Podell | 333/168 |
| 3,659,217 A | * | 4/1972 | Korn | 330/126 |
| 3,673,520 A | * | 6/1972 | Taylor | 333/76 |
| 3,781,475 A | * | 12/1973 | Sharp | 381/387 |
| 4,395,688 A | * | 7/1983 | Sellers | 333/169 |
| 4,718,100 A | * | 1/1988 | Brisson | 174/115 |
| 4,847,904 A | * | 7/1989 | McShane | 381/89 |
| 5,227,962 A | | 7/1993 | Marsh | 363/39 |
| 5,260,862 A | | 11/1993 | Marsh | 363/39 |
| 5,920,468 A | * | 7/1999 | Brisson et al. | 363/39 |
| 5,956,410 A | * | 9/1999 | Brisson | 330/149 |
| 6,166,458 A | * | 12/2000 | Redburn et al. | 333/176 |
| 6,310,959 B1 | * | 10/2001 | Alexander | 333/132 |

OTHER PUBLICATIONS

Newcomb et al., Lattice Filters, Dec. 27, 1999, John Wiley & Sons, Inc.*

* cited by examiner

*Primary Examiner*—Forester W. Isen
*Assistant Examiner*—Laura A. Grier
(74) *Attorney, Agent, or Firm*—LaRiviere, Grubman & Payne, LLP

(57) ABSTRACT

A filter for suppressing noise surges and noise frequencies in ac power lines to an audio video load includes at least one noise suppression circuit. The noise suppression circuit in turn includes first and second inductors coupled to respective power lines in series with the load. A capacitor is coupled between the power lines at the input of the first inductor and the output of the second inductor. With this arrangement, the capacitor suppresses noise surges in the power line, while being protected by the second inductor from being damaged by the surges. Also, the filter suppresses two noise frequencies using only the single capacitor. If desired, additional noise suppression circuits can be provided, with each noise suppression circuit suppressing two noise frequencies using only a single capacitor.

15 Claims, 3 Drawing Sheets

AC POWER SOURCE FILTER FOR AUDIO VIDEO ELECTRICAL LOAD

TECHNICAL FIELD

The present invention relates generally to power source filters, and more particularly to filters for suppressing noise from ac power sources used to energize audio video electrical equipment.

BACKGROUND ART

Audio and video electrical equipment such as audio amplifiers, video camera recorders, televisions, and the like (collectively referred to herein as "audio video" equipment, whether solely audio, solely video, or a combination thereof) typically are energized with standard alternating current (ac) power operating at 120 volts and a frequency of 60 Hertz. It happens that electrical noise is often present in the power that is supplied to audio video equipment, and this electrical noise can degrade the performance of the equipment that it energizes.

Accordingly, noise filters have been provided to suppress noise in ac power lines. As recognized by the present invention, electrical noise from an ac power source can include spurious power surges and frequency-based noise. To suppress power surges in power lines before the power surges reach the load, a filter can be provided, with the filter including a capacitor that is coupled across the power lines, in parallel with the load, at the input of the load. As understood by the present invention, however, particularly large power surges can cause the capacitor to fail, thereby rendering the filter that incorporates the capacitor inadequate for suppressing subsequent power surges. Accordingly, the present invention recognizes the desirability of providing a power line input capacitor to suppress power surges to audio video equipment, while prolonging the useful life of the input capacitor.

The present invention, in considering frequency-based noise, recognizes that noise at a particular frequency can be removed from an ac power line by providing a filter having an inductor and a capacitor arranged and tuned for suppressing signals having the frequency of the noise sought to be removed. As further recognized herein, in conventional filters a separate inductor-capacitor pair is provided for each frequency sought to be removed. In other words, to remove two frequencies, two inductor-capacitor pairs are typically provided, three pairs to remove three frequencies, and so on. The present invention understands, however, that it would be cost-effective to provide a power line filter for audio video equipment wherein a single capacitor can be used to suppress more than one noise frequency.

Accordingly, it is an object of the present invention to provide a noise filter for an ac power line to audio video equipment that suppresses noise surges. Another object of the present invention is to provide a noise filter for an ac power line to audio video equipment that prolongs the life of an input capacitor for suppressing noise surges. Still another object of the present invention is to provide a noise filter for an ac power line to audio video equipment that suppresses more than one noise frequency while minimizing the number of electrical components in the filter. Yet another object of the present invention is to provide a noise filter for an ac power line to audio video equipment that is easy to use and cost-effective to manufacture.

Other features of the present invention are disclosed or apparent in the section entitled: "BEST MODE FOR CARRYING OUT THE INVENTION."

DISCLOSURE OF INVENTION

A filter is disclosed for suppressing noise in at least first and second power lines used for electrically connecting an ac power source to an audio video load, i.e., a load that produces either audio, or video, or both. The filter includes a first inductor that is coupled to the first power line in series between the power source and the load. Also, the filter includes a second inductor that is coupled to the second power line in series between the power source and the load.

In accordance with the present invention, a capacitor is coupled between an input side of the first inductor and an output side of the second inductor. With this combination, the capacitor can absorb noise surges while being somewhat protected from damage by the second inductor. Furthermore, the inductances of the inductors and the capacitance of the capacitor are established for suppressing at least two predetermined frequencies in the power lines, using only a single capacitor.

Additionally, multiple capacitor/inductor combinations can be provided for suppressing noise at additional frequencies. More specifically, a first capacitor with first and second inductors can be provided as described above, and a third inductor can be provided in series with the first inductor. Also, a fourth inductor can be provided in series with the second inductor, with a second capacitor being coupled between an input side of the third inductor and an output side of the fourth inductor. Consequently, the filter suppresses four predetermined frequencies with only two capacitors.

In another aspect, a device is disclosed for suppressing ac power line noise to an audio video load. The device includes first and second power lines configured for electrically connecting an ac power source to the audio video load. Additionally, first and second inductors are respectively coupled to the first and second power lines, and each inductor defines a respective input side and a respective output side. At least one capacitor is coupled to a capacitor line. As intended by the present invention, the capacitor line is attached to the input side of the first inductor and to the output side of the second inductor.

In still another aspect, a method for suppressing noise at the power supply input of audio video equipment that is coupled to a source of 60 Hz ac power having a first power line and a second power line includes coupling a filter to the power lines. The filter has at least one circuit which includes at least a first inductor coupled to the first power line in series between the power source and the load, and at least a second inductor coupled to the second power line in series between the power source and the load. At least a first capacitor is coupled to the first power line upstream of the first inductor and to the second power line downstream of the second inductor. With this filter, noise surges and at least two noise frequencies in one or more of the power lines are suppressed by the filter.

The details of the present invention, both as to its structure and operation, can best be understood in reference to the accompanying drawings, in which like reference numerals refer to like parts.

BRIEF DESCRIPTION OF DRAWINGS

For fuller understanding of the present invention, reference is made to the accompanying drawing in the following detailed description of the Best Mode of Carrying Out the Present Invention. In the drawings.

BEST MODE FOR CARRYING OUT THE INVENTION

Figure 1:
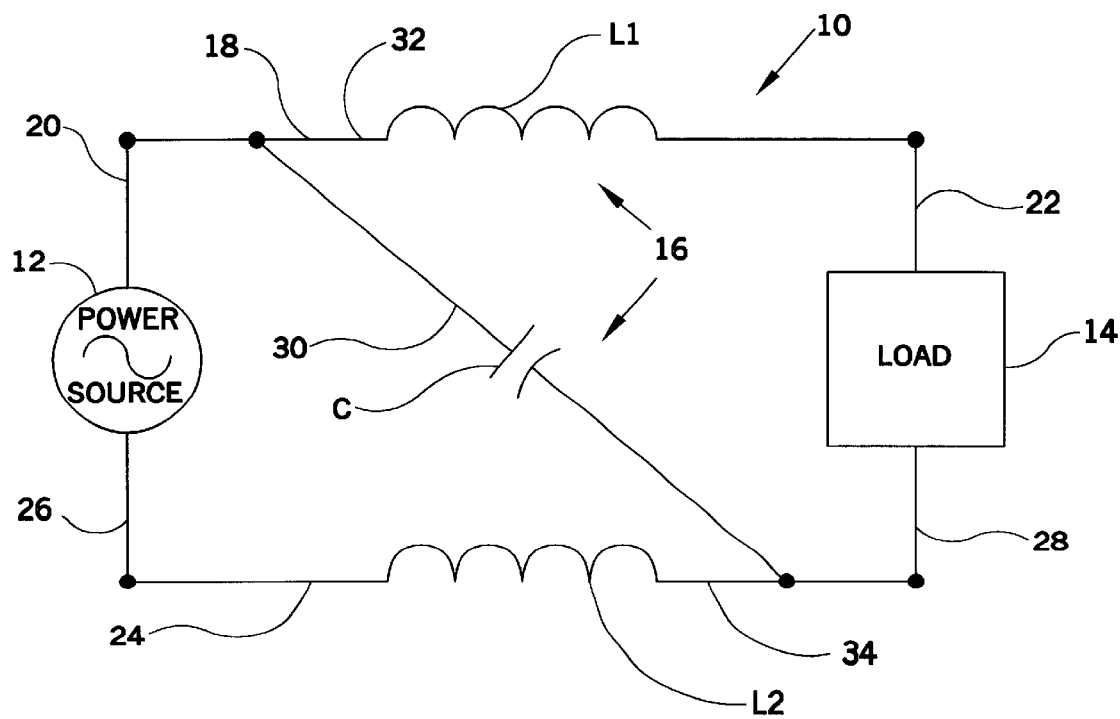
FIG. 1 is an electrical schematic diagram of the ac power source filter for audio video equipment.

Referring initially to FIG. 1, an ac power source filter for audio video equipment is shown, generally designated 10, for electrically suppressing both noise surges and predetermined frequencies at which noise is expected to be present between a 60 Hertz, 120 volt ac power source 12 and an audio video load 14. The power source 12 can operate at voltages other than 120 and at frequencies at other than 60 Hz. The audio video load 14 can be an audio amplifier, a video monitor, or a combined audio/video (A/V) device such as a television or VCR.

As shown in FIG. 1, the filter 10 includes at least one noise suppression circuit 16. In turn, the noise suppression circuit 16 includes a first inductor L1 that is connected to a first power line 18, with the first power line 18 (and, hence, the first inductor L1) being coupled in series between the power source 12 and the load 14. More specifically, the first power line 18 can be connected to a first power source line 20 and to a first load line 22 by conventional means, e.g., by plugs, clips, crimp connectors, fastener connectors, soldering, and so on. It is to be understood that while FIG. 1 shows three lines 18, 20, 22 in series between the power source 12 and load 14, a single integrated power line can interconnect the source and load, with the first inductor L1 coupled to the integrated power line.

Additionally, the noise suppression circuit 16 includes a second inductor L2 that is connected to a second power line 24, with the second power line 24 (and, hence, the second inductor L2) being coupled in series between the power source 12 and the load 14. More specifically, the second power line 24 can be connected to a second power source line 26 and to a second load line 28 by conventional means.

As used herein, the terms "input" and "output" are relative the load 14. Stated differently, the "input" of a component is located between the power source 12 and the component, whereas the "output" of a component is located between the load 14 and the component, regardless of the direction of electron flow through the component. Likewise, a first circuit location is "upstream" of a second circuit location if the first location is between the power source 12 and the second location. On the other hand, a first circuit location is "downstream" of a second circuit location if the first location is between the load 14 and the second location.

With the above in mind, a capacitor "C" is connected to a capacitor line 30, and the capacitor line 30 is electrically connected to the first power line 18 upstream of the first inductor L1. Also, as shown the capacitor line 30 is electrically connected to the second power line 24 downstream of the second inductor L2. In one preferred embodiment, the capacitor line 30 is mechanically attached, as by soldering or by means of an electrical connector, to the first power line 18 upstream of the first inductor L1. Likewise, the capacitor line 30 is mechanically attached to the second power line 24 downstream of the second inductor L2.

Accordingly, the capacitor "C" is coupled between an input side 32 of the first inductor L1 and an output side 34 of the second inductor L2. Thus, the capacitor "C" is coupled to the first power line 18 upstream of the first inductor L1, and is coupled to the second power line 24 downstream of the second inductor L2. It is to be understood that the capacitor "C" alternatively can be coupled between the output side of the first inductor L1 and the input side of the second inductor L2.

It may now be appreciated that because the capacitor "C" is coupled to the first power line 18 upstream of any other component of the noise suppression circuit 16, power surges in the present power lines can be absorbed by the capacitor "C". However, because the capacitor "C" is coupled to the second power line 24 downstream of the second inductor L2 and, hence, because power surges absorbed by the capacitor "C" must also propagate through the second inductor L2, the capacitor "C" is somewhat protected by the second inductor L2. Consequently, the useful life of the capacitor "C" is prolonged, vis-a-vis the useful life of input capacitors that are connected at both ends to power lines upstream of any other filtering components.

Figure 2:
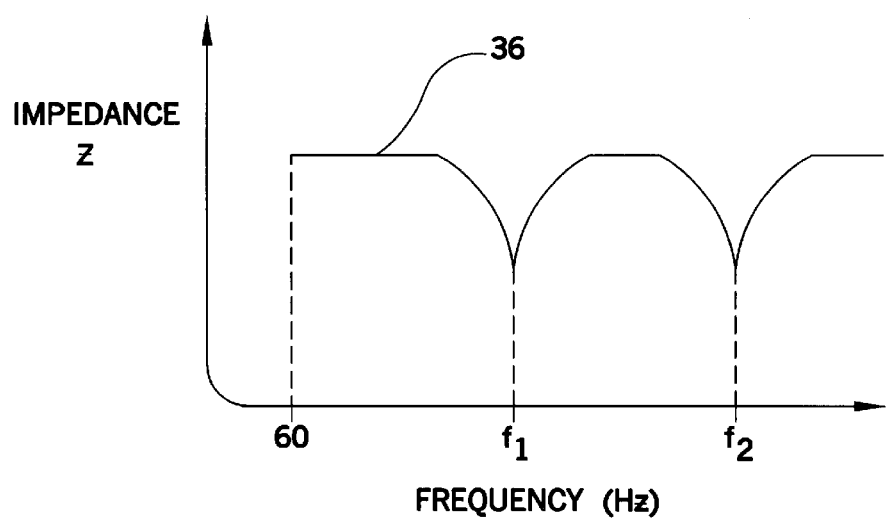
FIG. 2 is a graph of impedance versus frequency for the filter shown in FIG. 1.

Furthermore, I have discovered that the above-described structure of the filter 10 enables the filter 10 to suppress two frequencies at which noise might be present, using only the single capacitor "C". Specifically, referring now to FIG. 2, a noise response curve 36 is shown on a graph of impedance versus frequency using the filter 10 shown in FIG. 1 above, with signals at a first frequency $f_1$ and at a second frequency $f_2$ being substantially suppressed. By "substantially suppressed" is meant attenuated by several decibels (db), e.g., by between five and 18 decibels (5 db–18 db) or more relative to signals at other frequencies.

In one preferred embodiment, both of the frequencies $f_1$ and $f_2$ are greater than 60 Hz. In an exemplary embodiment, the inductors L1, L2 each have type 28B1417-200 cores, the capacitor "C" has a capacitance of a hundredth of a farad (0.0 F), and the frequencies $f_1$, $f_2$ respectively are nine hundred fifty five thousand Hertz (0.955 MHz) and eight million nine hundred Hertz (8.9 MHz). In any case, the inductances of the inductors L1, L2 and the capacitance of the capacitor "C" are established for suppressing two predetermined frequencies $f_1$ and $f_2$ in the power lines 18, 24.

Figure 3:
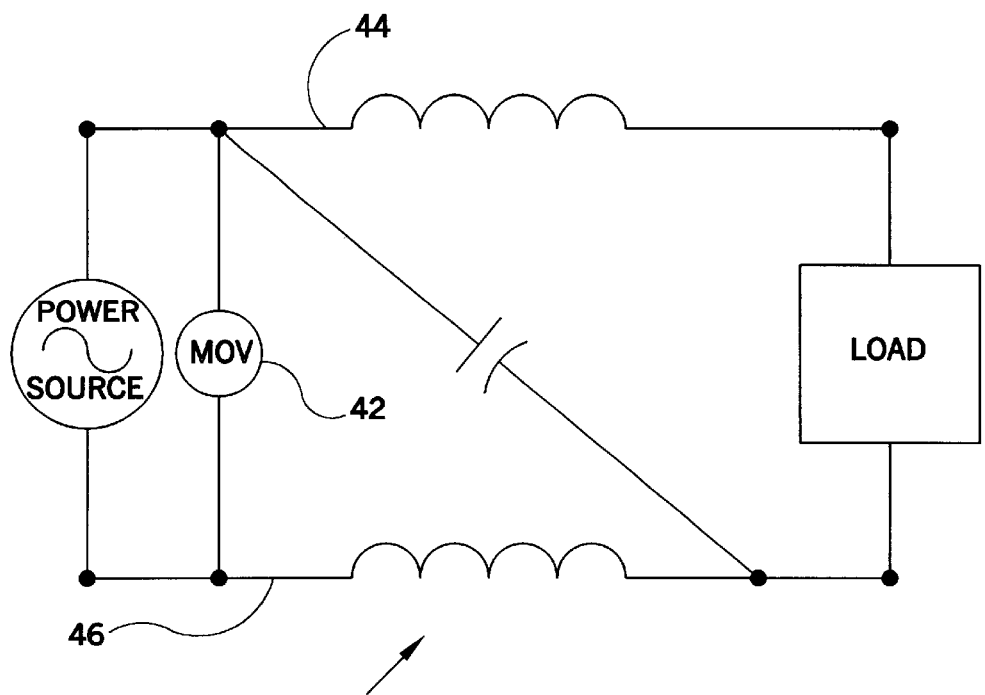
FIG. 3 is an electrical schematic diagram of an alternate power source filter incorporating a metal oxide varistor.

FIG. 3 shows a filter, generally designated 40, that is in all essential respects identical to the filter 10 shown in FIG. 1, with the exception that a metal oxide varistor (MOV) 42 is coupled between power lines 44, 46 in parallel with an audio video load. The MOV 42 is coupled to the circuit upstream of the remaining components of the filter 40 to further absorb noise surges.

Figure 4:
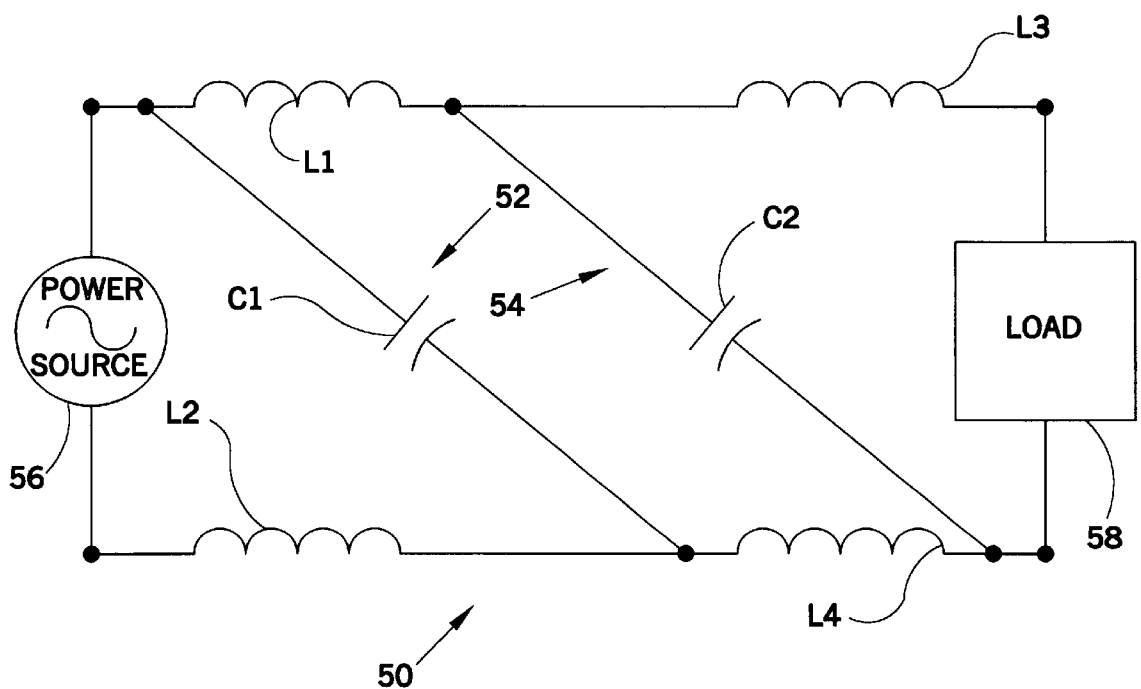
FIG. 4 is an electrical schematic diagram of an alternate power source filter having two capacitors and four inductors for suppressing four noise frequencies.

FIG. 4 shows a filter, generally designated 50, that includes a first noise suppression circuit 52 and a second noise suppression circuit 54, with the circuits 52, 54 being in series with each other as shown between a power source 56 and an audio video load 58. Each circuit 52, 54 is identical in configuration to the noise suppression circuit 16 shown in FIG. 1. Accordingly, the first noise suppression circuit 52 includes a first capacitor C1 and first and second inductors L1, L2 arranged in the configuration discussed above. Moreover, the second noise suppression circuit 54 includes a second capacitor C2 and third and fourth inductors L3, L4, with the third inductor L3 being in series with the first inductor L1 and the fourth inductor L4 being in series with the second inductor L2.

Figure 5:
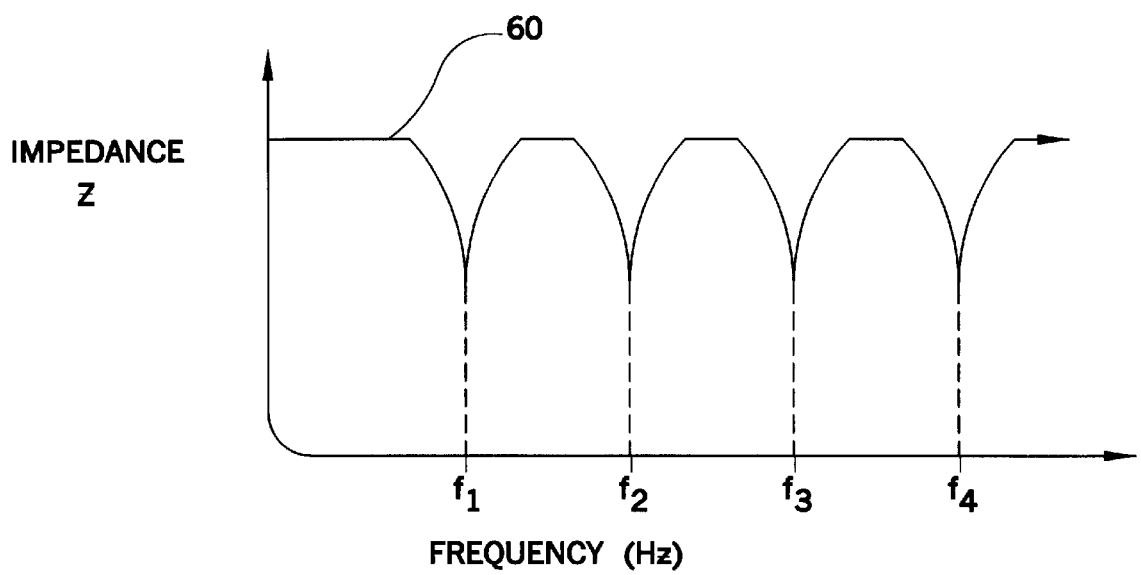
FIG. 5 is a graph of impedance versus frequency for the filter shown in FIG. 4.

FIG. 5 shows that with the filter 50 shown in FIG. 4, four predetermined frequencies $f_1$, $f_2$, $f_3$, and $f_4$ can be suppressed with the use of only two capacitors C1, C2. Specifically, a noise response curve 60 is shown on a graph of impedance versus frequency using the filter 50 shown in FIG. 4, with signals at the first, second, third, and fourth frequencies $f_1$, $f_2$, $f_3$, and $f_4$ being substantially suppressed. The principles disclosed herein can be extended to filters having three or more of the noise suppression circuits disclosed herein for suppressing six or more noise frequencies.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A filter for suppressing noise in at least first and second power lines used for electrically connecting an audio video load to an ac power source, comprising:
   a first inductor coupled to the first power line in series between the power source and the load for presenting an impedance to noise;
   a second inductor coupled to the second power line in series between the power source and the load for presenting an impedance to noise and preventing damage to components connected to its output; and
   a capacitor coupled between an input side of the first inductor and protected and output side of the second inductor and protected from power surges by said second inductor for short circuiting high frequency noise.

2. A filter for suppressing noise in at least first and second power lines used for electrically connecting an audio video load to an ac power source, comprising:
   a first inductor coupled to the first power line in series between the power source and the load;
   a second inductor coupled to the second power line in series between the power source and the load; and
   a capacitor coupled between an input side of the first inductor and an output side of the second inductor, wherein the inductors are characterized by respective inductances and the capacitor is characterized by a capacitance, and the inductances and capacitance are established for suppressing at least two predetermined frequencies in the power lines.

3. A filter for suppressing noise in at least first and second power lines used for electrically connecting an audio video load to an ac power source, comprising:
   a first inductor coupled to the first power line in series between the power source and the load;
   a second inductor coupled to the second power line in series between the power source and the load; and
   a capacitor coupled between an input side of the first inductor and an output side of the second inductor, further comprising a metal oxide varistor coupled to the power lines in parallel with the load at an input side of the filter.

4. A filter for suppressing noise in at least first and second power lines used for electrically connecting an audio video load to an ac power source, comprising:
   a first inductor coupled to the first power line in series between the power source and the load;
   a second inductor coupled to the second power line in series between the power source and the load; and
   a capacitor coupled between an input side of the first inductor and an output side of the second inductor, wherein the capacitor is a first capacitor, and the filter further comprises:
   a third inductor in series with the first inductor;
   a fourth inductor in series with the second inductor; and
   a second capacitor coupled between an input side of the third inductor and an output side of the fourth inductor, whereby the filter suppresses at least four predetermined frequencies.

5. A filter for suppressing noise in at least first and second power lines used for electrically connecting an audio video load to an ac power source, comprising:
   a first inductor coupled to the first power line in series between the power source and the load;
   a second inductor coupled to the second power line in series between the power source and the load; and
   a capacitor coupled between an input side of the first inductor and an output side of the second inductor, in combination with the audio video load.

6. A device for suppressing ac power line noise to an audio video load, comprising:
   at least first and second power lines configured for electrically connecting an ac power source to the audio video load;
   at least first and second inductors respectively coupled to the first and second power lines, each defining a respective input side and a respective output side for presenting an impedance to noise; and
   at least one capacitor coupled to a capacitor line, the capacitor line being attached to the input side of the first inductor and to the output side of the second inductor and protected from power surges by said second inductor for short circuiting high frequency noise.

7. The device of claim 6, wherein the inductors are coupled to the power lines in series between the power source and the load.

8. The device of claim 7, wherein the inductors are characterized by respective inductances and the capacitor is characterized by a capacitance, and the inductances and capacitance are established for suppressing at least two predetermined frequencies in the power lines.

9. The device of claim 7, further comprising a metal oxide varistor coupled to the power lines in parallel with the load at an input side of the device.

10. The device of claim 7, wherein the capacitor is a first capacitor, and the device further comprises:
    a third inductor in series with the first inductor;
    a fourth inductor in series with the second inductor; and
    a second capacitor coupled between an input side of the third inductor and an output side of the fourth inductor, whereby the device suppresses four or more predetermined frequencies.

11. The device of claim 7, in combination with the audio video load.

12. A method for suppressing noise at the power supply input of audio video equipment coupled to a source of 60 Hz ac power, the source having a first power line and a second power line, comprising the step of:
    coupling a filter to the power lines, the filter having at least one circuit, the at least one circuit including:
    at least a first inductor coupled to the first power line in series between the power source and the load, at least a second inductor coupled to the second power line in series between the power source and the load, and at least a first capacitor, the capacitor being coupled to the first power line upstream of the first inductor, the capacitor being coupled to the second power line downstream of the second inductor, whereby noise surges and at least two noise frequencies in one or more of the power lines are suppressed by the filter.

13. The method of claim 12, further comprising the step of:

establishing the capacitance of the capacitor and the inductances of the inductor as appropriate for suppressing at least two predetermined ac frequencies.

14. The method of claim 12, further comprising the step of coupling a metal oxide varistor to the power lines in parallel with the load at the input sides of the inductors.

15. The method of claim 12, wherein the capacitor is a first capacitor, and the method further comprises:

coupling a third inductor in series with the first inductor;

coupling a fourth inductor in series with the second inductor; and coupling a second capacitor between an input side of the third inductor and an output side of the fourth inductor, whereby the filter suppresses four predetermined frequencies.

* * * * *